United States Patent
Lim et al.

(10) Patent No.: US 9,639,225 B2
(45) Date of Patent: May 2, 2017

(54) METHOD AND APPARATUS FOR DETECTING A TOUCH ON A DEVICE

(71) Applicant: MOTOROLA SOLUTIONS, INC, Schaumburg, IL (US)

(72) Inventors: Bing Qin Lim, Jelutong (MY); Murali Kuyimbil, Bayan Baru (MY); Wai Mun Lee, Penang (MY); Lee Sun Ooi, Kulim (MY); Wooi Ping Teoh, Georgetown (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 102 days.

(21) Appl. No.: 14/858,149

(22) Filed: Sep. 18, 2015

(65) Prior Publication Data

US 2017/0083126 A1    Mar. 23, 2017

(51) Int. Cl.
*G06F 3/045* (2006.01)
*G06F 3/044* (2006.01)
*H03L 7/099* (2006.01)

(52) U.S. Cl.
CPC ............ *G06F 3/044* (2013.01); *H03L 7/099* (2013.01)

(58) Field of Classification Search
None
See application file for complete search history.

(56) References Cited

U.S. PATENT DOCUMENTS

| | | | |
|---|---|---|---|
| 3,254,313 A | 5/1966 | Atkins et al. | |
| 3,629,665 A | 12/1971 | Hoste | |
| 4,267,522 A | 5/1981 | Periot | |
| 4,449,122 A | 5/1984 | Whitmer | |
| 4,618,853 A | 10/1986 | Yuchi | |
| 5,465,091 A | 11/1995 | Nishino et al. | |
| 7,952,366 B2 | 5/2011 | Philipp | |
| 8,421,483 B2 | 4/2013 | Klinghult et al. | |
| 2012/0214412 A1 | 8/2012 | Schlub et al. | |
| 2012/0235689 A1* | 9/2012 | Jau | A61B 5/0205 324/629 |
| 2014/0071008 A1 | 3/2014 | Desclos et al. | |

* cited by examiner

*Primary Examiner* — Ilana Spar
*Assistant Examiner* — Kirk Hermann

(57) ABSTRACT

A method and circuitry for detecting a touch on a device is provided herein. Touch-sensing circuitry comprises two antennas coupled to two voltage-controlled oscillators (VCOs). A phase locked loop (PLL) is provided coupled to the VCOs. The PLL compares a VCO output with a frequency source (temperature controlled crystal oscillator (TCXO)), and outputs a tuning voltage (steering voltage) for the VCO that is based on the difference between the VCO frequency and the TCXO frequency. The steering voltages for each VCO are compared, and a decision is made as to whether or not a touch has been made to the antennas. If the antennas have been touched, a location of the touch is determined based on a difference in the steering voltages of the two VCOs.

12 Claims, 3 Drawing Sheets

METHOD AND APPARATUS FOR DETECTING A TOUCH ON A DEVICE

FIELD OF THE INVENTION

The present invention generally relates to detecting a touch on a device, and more particularly to the use of at least one phase locked loop to detect a touch on a device.

BACKGROUND OF THE INVENTION

Oftentimes public-safety officers will need to use a device while they are wearing gloves. For example, fire fighters battling a fire will often wear gloves. This makes operating any touch-sensitive electronic device practically impossible. For example, the fire fighter's radio is often equipped with a touch screen. Using the touch screen by a fire fighter who is wearing gloves is practically impossible. Therefore, a need exists for a method and apparatus for detecting a touch on a device that alleviates the above-mentioned problems.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

Figure 1:
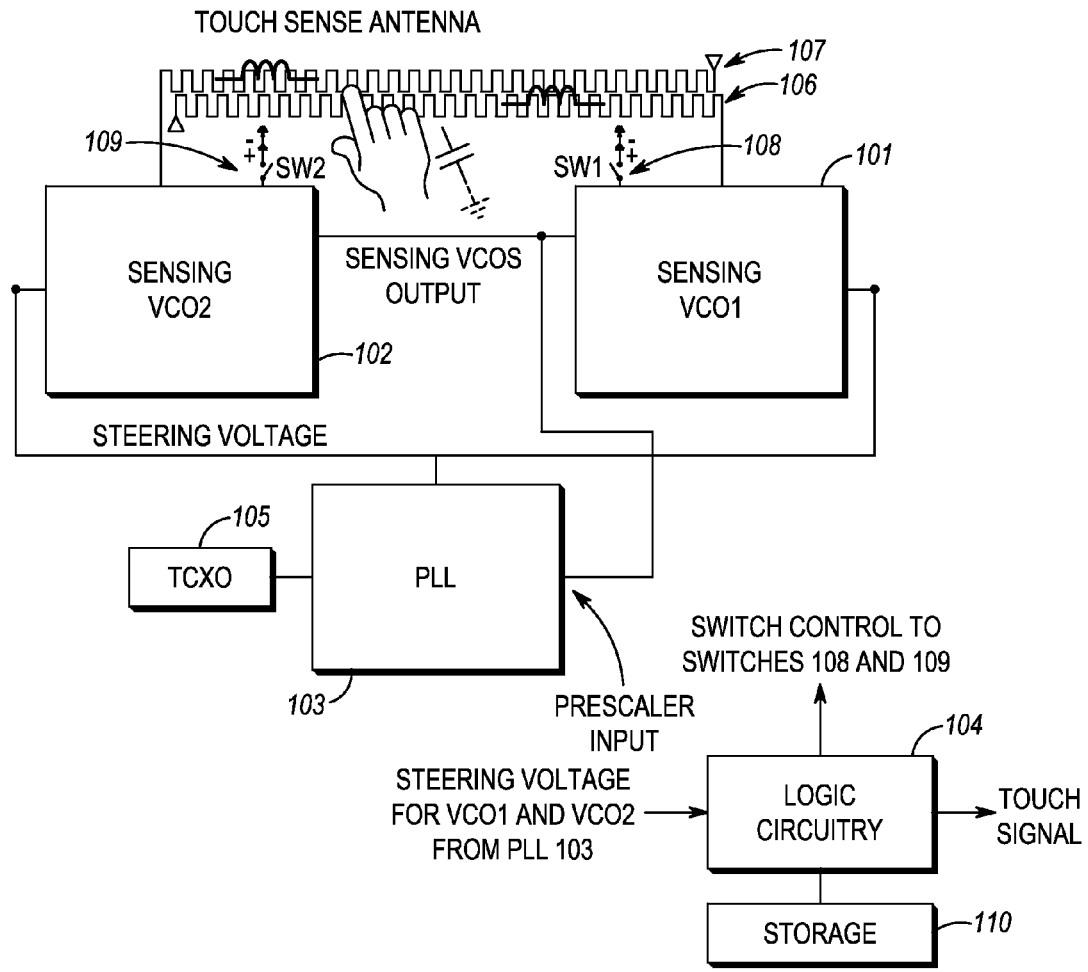
FIG. 1 is a block diagram of touch-sensitive circuitry.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required.

DETAILED DESCRIPTION

In order to address the above, mentioned need, a method and circuitry for detecting a touch on a device is provided herein. The circuitry comprises two antennas coupled to two voltage-controlled oscillators (VCOs). A phase locked loop (PLL) is provided coupled to the VCOs. Switches are provided so that only one VCO output at a time will appear at a prescaler input of the phase locked loop. The PLL compares a VCO output with a frequency source (temperature compensated crystal oscillator (TCXO)), and outputs a tuning voltage (steering voltage) for the VCO that is based on the difference between the VCO frequency and the TCXO frequency. The steering voltages for each VCO are compared, and a decision is made as to whether or not a touch has been made to the antennas. If the antennas have been touched, a location of the touch is determined based on a difference in the steering voltages of the two VCOs.

In one embodiment of the present invention, the two VCOs are preferably operating at similar frequencies. Additionally, both VCOs are designed to be substantially identical so that both VCOs will have a similar amount of frequency drift (and thus a similar amount of steering voltage drift) over temperature and self-compensated when the difference of the steering voltage is used to determine a touch position.

Expanding on the above, when a user touches an antenna that is coupled to a VCO, the effective inductance of the antenna is changed and thus the resonance frequency of the VCO coupled to the antenna is changed. This causes the PLL to change the steering voltage of the VCO. Touching the antenna at different positions will give different effective inductance and thus produce different amount of frequency change, and thus a different steering voltage. A hand touch will give larger amount of frequency change compared to a glove touch and different gloves will give different levels of frequency change due to different amount of capacitance introduced at the antenna.

When two antennas are arranged to lie in parallel, and in opposite directions a change of the two VCOs frequencies can be used to not only determine that a touch has been made to the antennas, but also used to determine a relative position of the touch on each antenna. For example, for a particular antenna configuration, when the change of frequency at VCO1 is larger than the change in frequency at VCO2 it indicates that a touch is made at one end of the antennas and vice versa; while if both frequency changes are about the same, then it indicates that the touch has occurred at the center of both antennas. The two antennas may terminate as open or grounded, so that the open/grounded end of a first antenna lies adjacent to the VCO input of another antenna, and vice versa.

FIG. 1 is a block diagram of touch-sensitive circuitry. As shown, the circuitry in FIG. 1 comprises first VCO 101, second VCO 102, and PLL 103. VCO 101 and VCO 102 comprise an electronic oscillator whose oscillation frequency is controlled by an input voltage (steering voltage). The VCOs may operate at the same, or differing frequencies. The applied steering voltage determines the instantaneous oscillation frequency of the VCO.

PLL 103 comprises a control system that generates an output signal (used as the steering voltage to each VCO) related to a phase difference between a source (TCXO 105) and an output of a VCO (i.e., VCO 101 or 102). TCXO 105 generates a periodic signal that is used as a comparison signal by PLL 103. PLL 103 compares a phase of TXCO 105 with the phase of a VCO and adjusts the VCO until the phase difference is constant (signifying a matched frequency between the two), thus bringing the VCO frequency back toward the input signal generated by TXCO 105. It should be noted that a divider (not shown) may exist to divide down the VCO frequency to lower freq to match with the TCXO frequency/phase.

The two VCOs are turned on and off by controlling switch SW1 108 and SW2 109 at the collectors of the VCOs (FIG. 1). Only one VCO will be turned on at one time. The two VCOs will take turns to turn on in sequence. The VCO lock time is very fast ~3 ms and less than 9 ms is needed to complete a sampling cycle for a pair of sensing VCOs.

Antennas 106 and 107 comprise a conductor such as a metallic wire, plate, . . . , etc. Antennas 106 and 106 may comprise any type of antenna, including, but not limited to a monopole antenna, a dipole antenna, a loop antenna, a PIFA, a coil antenna, and an inductor component. The antennas preferably lie under a substrate (not shown in FIG. 1). The substrate preferably comprises interface user control interface features such as knobs, buttons, touch pads, touch screens, device casing, device housing, switches, soft buttons/switches, soft controls, . . . , etc. The two antennas are arranged so that they are substantially parallel to each other, but lying in opposite directions. More particularly, the two antennas are arranged so that the end of one antenna is at substantially a same location as the beginning of another antenna. With this configuration, the inputs from VCO 101 and VCO 102 to antennas 106 and 107 are substantially a maximum distance from each other along a length of the combined antennas 106 and 107. In other words, the end of antenna 106 lies near the beginning of antenna 107, and vice versa.

Logic circuitry 104 comprises a digital signal processor (DSP), general purpose microprocessor, a programmable logic device, or application specific integrated circuit (ASIC) and is utilized to detect a touch based a comparison of the steering voltages from each VCO. A touch signal is output from logic circuitry 104 and is used to indicate contact with interface objects existing on the substrate (e.g., knobs, buttons, touch pads, touch screens, device casing, device housing, switches, soft buttons/switches, soft controls, . . . , etc.). A touch signal is output from logic circuitry 104 that indicates that contact has been made with an interface object. This touch signal is preferably used by a device to control the device. For example, increase or decrease a volume, initiate a push-to-talk call, launch a particular application, or any other function executed by the device.

Storage 110 (database 110) comprises standard random access memory and is used to store information related to a difference in steering voltages as they relate to touch positions on antennas 106 and 107. More particularly, database 110 contains a location and a steering voltage difference pair that is generated as part of a calibration process. By applying minimum and maximum threshold for a valid touch, false detection (e.g. hand over the whole touch sensing area, touching on the bottom of the sensing element etc.) can be avoided. Additionally, by determining a steering voltage difference for various positions, all the touch detections for those positions can be determined by comparing a difference in steering value between VCOs.

The above calibration is possible since touching the antennas at different positions will give different effective inductances and thus produce different amount of steering voltages.

Figure 2:
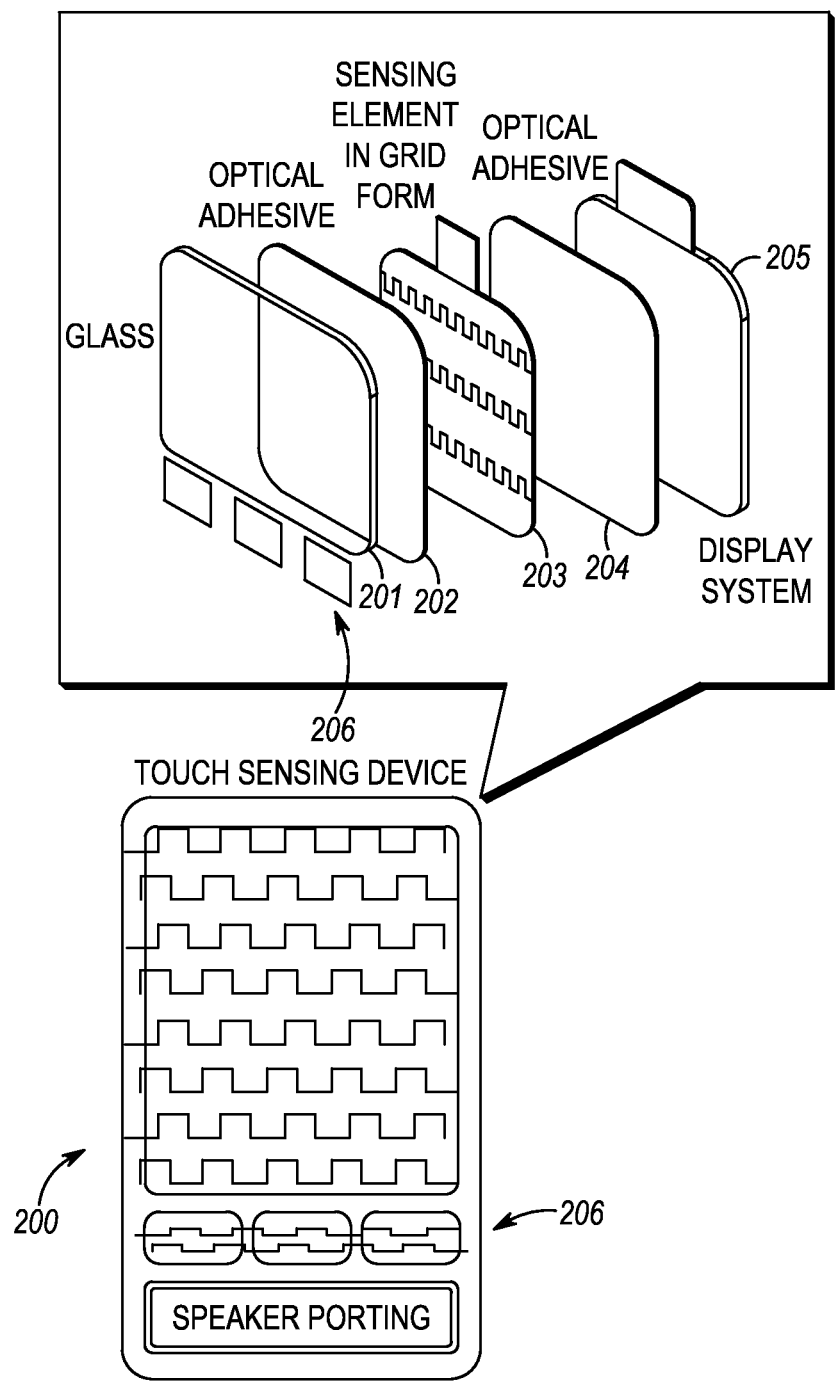
FIG. 2 illustrates a touch-sensing device.

It should be noted that while only two antennas and VCOs are shown in FIG. 1, one of ordinary skill in the art will recognize that multiple antennas coupled to any number of VCOs may exist under a substrate. This is illustrated in FIG. 2. It should also be noted that a particular sensing VCO may be coupled to more than one antenna, switching between the two.

The above circuitry provides for a device (apparatus) detecting a touch on a device, the device comprises a first antenna, a second antenna, a first voltage controlled oscillator (VCO) coupled to the first antenna, a second VCO coupled to the second antenna, a phase locked loop (PLL) coupled to the first and the second VCOs and outputting a first and a second steering voltage for the first and the second VCO, and logic circuitry detecting the touch by comparing a difference between the first and the second steering voltages.

As discussed above, the first and the second antenna lie substantially parallel to each other. Additionally, the first and the second antenna lie in substantially opposite directions to each other.

A third oscillator (TXCO) is provided that is coupled to the PLL and serves as a frequency source for the PLL. The first steering voltage is generated based on a phase difference between the first VCO and the third oscillator and the second steering voltage is generated based on a phase difference between the second VCO and the third oscillator.

The apparatus further comprises a database populated with differences in steering voltage as they apply to a location of the touch, and at least one user control interface (e.g., a soft key or button) existing above the first and the second antenna.

FIG. 2 illustrates touch-sensing device 200. Device 200 may comprise any electronic device, such as, but not limited to a radio, a computer, a tablet computer, a cellular telephone, a public-safety communications device, . . . , etc. As shown, device 200 comprises multiple antennas located on substrate 203. Glass 201 serves as a substrate lying over a portion of antenna grid 203. In additions, interface objects 206 (e.g., buttons) serve as a substrate lying over a second portion of antenna grid 203. Finally, an optional display system 205 (such as an LCD or LED screen) may be placed under at least a portion of antenna grid 203. Glass 201, antenna grid 203, buttons 206, and display system 205 are preferably held together via adhesive layers 202 and 204. The antennas will be in opposite direction to the adjacent one so that a $1^{st}$ antenna and $2^{nd}$ antenna can be paired to sense $1^{st}$ row of positions (left, middle, right), a $2^{nd}$ antenna and a $3^{rd}$ antenna can be paired to sense $2^{nd}$ row of positions (left, middle, right), a $3^{rd}$ antenna and $4^{th}$ antenna can be paired to sense $3^{rd}$ row of positions (left, middle, right), and so on. A first group of antennas will detect a touch to interface objects 206, while a second group of antennas will detect a touch to glass 201.

Figure 3:
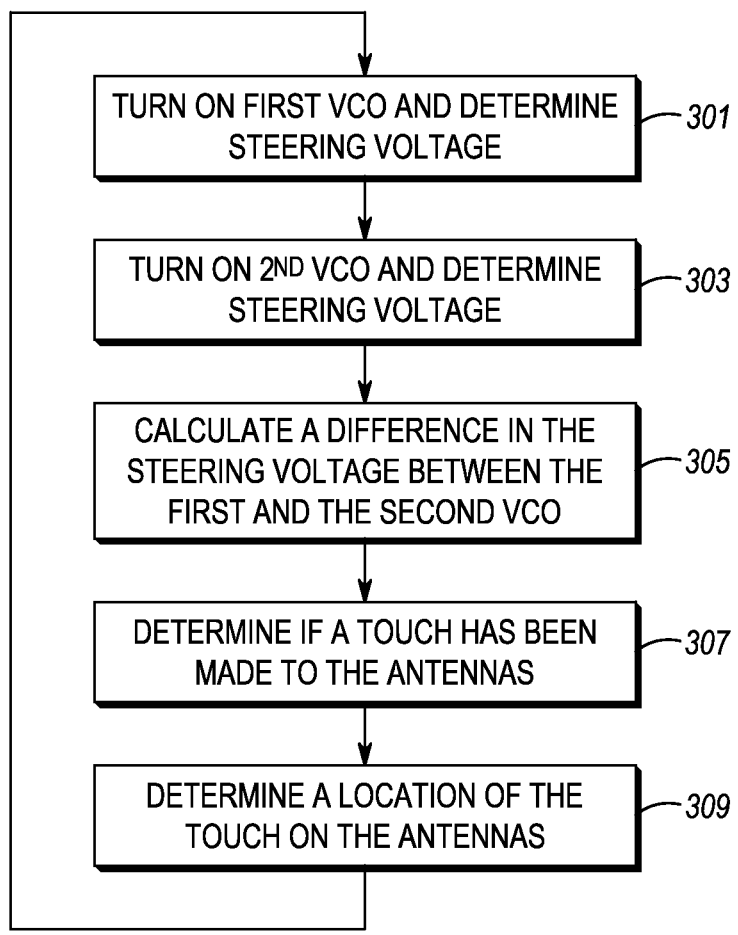
FIG. 3 is a flow chart showing operation of the device of FIG. 2.

FIG. 3 is a flow chart showing operation of the device of FIG. 2. The logic flow shown below assumes that device 200 has been calibrated and database 110 populated with threshold levels for touch detection (i.e., minimum and maximum values of steering voltages prior to determining a positive touch event). Database 110 is also populated with a list of differences in steering voltages between two VCOs as it relates to a position of touch on device 200. The logic flow begins at step 301 where logic circuitry 104 outputs a signal to switch 108 and activates (turns on) first VCO 101 and determines a steering voltage output from PLL 103. At step 303 logic circuitry 204 outputs a signal to switch 109 and activates (turns on) second VCO 102 and determines a steering voltage output from PLL 103. Logic circuitry 104 then calculates a difference in the steering voltage between the first and the second VCO (step 305). Based on this difference, logic circuitry 104 determines if a touch has been made to antennas 106 and 107 (step 307), and determines a relative location on device 200 where the touch has been made (step 309).

As discussed above, the determination as to whether a touch has been made (step 307) and where the touch has been made (step 309) are accomplished by logic circuitry 104 accessing database 110 to determine a threshold level (for whether or not a touch has been made) and a location based on the difference in steering voltage. Once it has been determined that a touch has been made, and the location of the touch, logic circuitry 104 can output a touch signal, causing device 200 to execute a user-interactive control function. More particularly, if, for example, it has been determined that the touch has occurred under a PTT button, then a push-to-talk function may be executed. Additionally, if it has been determined that the touch has occurred under a "volume-up" or a "volume-down" button, then an appropriate change in volume may be executed by device 200.

The above logic flow provides for a method for detecting a touch on a device. The method comprises the steps of receiving a first steering voltage for a first VCO, the first steering voltage output from a PLL, receiving a second steering voltage for a second VCO, the second steering voltage output from the PLL, determining a difference in steering voltage between the first and the second steering voltages, and detecting the touch on the device based on a difference in the steering voltage between the first and the second steering voltages. As discussed above, The steering voltage for the first VCO is based on a contact with a first antenna, and the steering voltage for the second VCO is based on a contact with a second antenna.

In the foregoing specification, specific embodiments have been described. However, one of ordinary skill in the art appreciates that various modifications and changes can be made without departing from the scope of the invention as set forth in the claims below. For example, the above description is provided showing how to determine whether a touch has occurred on a device, and where on the device the touch has occurred. Many actions may take place by device 200 based on the location of the touch, and the specification is not meant to limit any such action. In addition, while the above description was given with multiple VCOs, each connected to a single antenna, one of ordinary skill in the art will recognize that a single VCO may be utilized, and switched between antennas. In other words, the first and the second VCO of FIG. 1 may be a same VCO, or share the same VCO circuitry. Accordingly, the specification and figures are to be regarded in an illustrative rather than a restrictive sense, and all such modifications are intended to be included within the scope of present teachings.

Those skilled in the art will further recognize that references to specific implementation embodiments such as "circuitry" may equally be accomplished via either on general purpose computing apparatus (e.g., CPU) or specialized processing apparatus (e.g., DSP) executing software instructions stored in non-transitory computer-readable memory. It will also be understood that the terms and expressions used herein have the ordinary technical meaning as is accorded to such terms and expressions by persons skilled in the technical field as set forth above except where different specific meanings have otherwise been set forth herein.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An apparatus for detecting a touch on a device, the apparatus comprising:
   a first antenna;
   a second antenna;
   a first voltage controlled oscillator (VCO) coupled to the first antenna;
   a second VCO coupled to the second antenna;
   a phase locked loop (PLL) coupled to the first and the second VCOs and outputting a first and a second steering voltage for the first and the second VCO; and
   logic circuitry detecting the touch by comparing a difference between the first and the second steering voltages.

2. The apparatus of claim 1 wherein the first and the second antenna lie substantially parallel to each other.

3. The apparatus of claim 2 wherein the first and the second antenna lie in substantially opposite directions to each other.

4. The apparatus of claim 3 further comprising:
   a third oscillator coupled to the PLL and serving as a frequency source for the PLL, and where the first steering voltage is generated based on a phase difference between the first VCO and the third oscillator; and
   wherein the second steering voltage is generated based on a phase difference between the second VCO and the third oscillator.

5. The apparatus of claim 4 further comprising:
   a database populated with differences in steering voltage as they apply to a location of the touch.

6. The apparatus of claim 5 further comprising a user control interface existing above the first and the second antenna.

7. The apparatus of claim 1 further comprising:
   a third oscillator coupled to the PLL and serving as a frequency source for the PLL, and where the first steering voltage is generated based on a phase difference between the first VCO and the third oscillator; and
   wherein the second steering voltage is generated based on a phase difference between the second VCO and the third oscillator.

8. The apparatus of claim 1 further comprising:
   a database populated with differences in steering voltage as they apply to a location of the touch.

9. The apparatus of claim 1 wherein the first and the second VCO share a same VCO circuitry.

10. A method for detecting a touch on a device, the method comprising the steps of:
    receiving a first steering voltage for a first VCO, the first steering voltage output from a PLL;
    receiving a second steering voltage for a second VCO, the second steering voltage output from the PLL;
    determining a difference in steering voltage between the first and the second steering voltages; and
    detecting the touch on the device based on a difference in the steering voltage between the first and the second steering voltages.

11. The method of claim 10 wherein the steering voltage for the first VCO is based on a contact with a first antenna, and the steering voltage for the second VCO is based on a contact with a second antenna.

12. The method of claim 10 wherein the first and the second antenna is taken from the group consisting of a monopole antenna, a dipole antenna, a loop antenna, a PIFA, a coil antenna, and an inductor component.

* * * * *